United States Patent [19]
Eda et al.

[11] Patent Number: 5,438,579
[45] Date of Patent: Aug. 1, 1995

[54] WAVELENGTH STABILIZING APPARATUS

[75] Inventors: Yukio Eda; Hirohisa Fujimoto, both of Hachiouji; Nahoko Hisata, Hino; Yukawa Hiroshi, Hachiouji, all of Japan

[73] Assignee: Olympus Optical Co., Ltd., Tokyo, Japan

[21] Appl. No.: 284,525

[22] PCT Filed: Dec. 16, 1993

[86] PCT No.: PCT/JP93/01824

§ 371 Date: Aug. 8, 1994

§ 102(e) Date: Aug. 8, 1994

[87] PCT Pub. No.: WO94/15388

PCT Pub. Date: Jul. 7, 1994

[30] Foreign Application Priority Data

Dec. 18, 1992 [JP] Japan .................... 4-338223
Apr. 20, 1993 [JP] Japan .................... 5-93078

[51] Int. Cl.$^6$ .............................................. H01S 3/04
[52] U.S. Cl. ................................... 372/34; 372/32; 372/46
[58] Field of Search ............... 372/34, 32, 46, 36, 372/29

[56] References Cited

U.S. PATENT DOCUMENTS

| | | | |
|---|---|---|---|
| 4,689,659 | 8/1987 | Watanabe | 372/34 |
| 4,710,631 | 12/1987 | Aotsuka et al. | 372/34 |
| 4,792,957 | 12/1988 | Kollanyi | 372/34 |
| 4,821,273 | 4/1989 | Hori | 372/31 |
| 5,018,154 | 5/1991 | Ohashi | 372/34 |
| 5,265,110 | 11/1993 | Naya | 372/21 |

FOREIGN PATENT DOCUMENTS

| | | |
|---|---|---|
| 61-161782 | 7/1986 | Japan . |
| 62-119993 | 6/1987 | Japan . |
| 62-160568 | 10/1987 | Japan . |
| 62-244184 | 10/1987 | Japan . |
| 63-143888 | 6/1988 | Japan . |
| 63-157488 | 6/1988 | Japan . |
| 5-75193 | 10/1993 | Japan . |
| 5-75194 | 10/1993 | Japan . |

*Primary Examiner*—Léon Scott, Jr.
*Attorney, Agent, or Firm*—Frishauf, Holtz, Goodman & Woodward

[57] ABSTRACT

An injection current controller 113 is provided to supply a given injection current. A semiconductor laser (LD) 112 receives the injection current from the injection current controller to output a laser beam. An etalon 114 discriminates the wavelength of the laser beam output from the semiconductor laser. A photodetector (PD) 116 is provided to detect the intensity of the output beam from the etalon. An LD temperature controller 117 performs temperature control of LD so as to bring the output of PD to a predetermined value and, when the output of PD becomes the predetermined value, reserves a corresponding temperature of LD and, at the next temperature control start time, initiates temperature control based on a finally reserved temperature of LD.

9 Claims, 14 Drawing Sheets

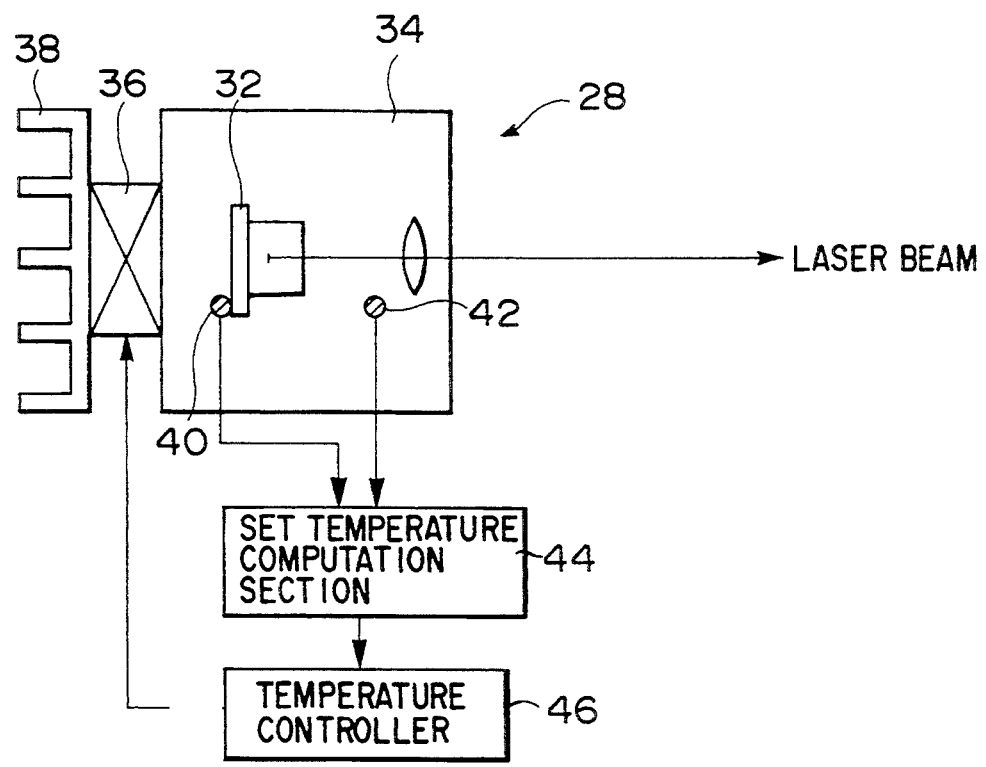
F I G. 1
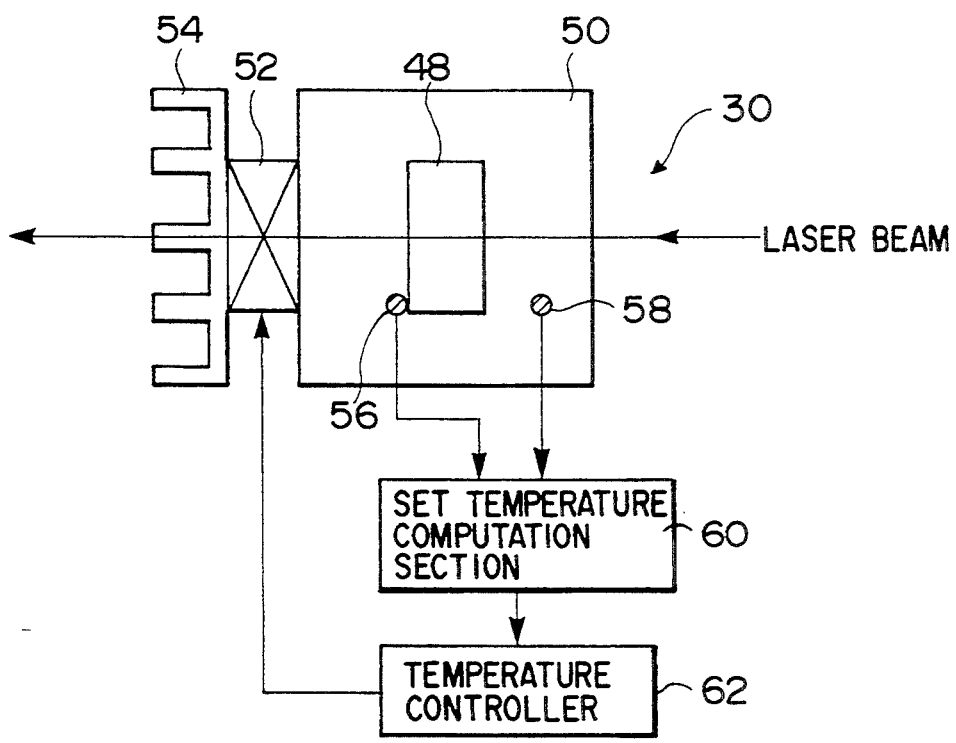
F I G. 2

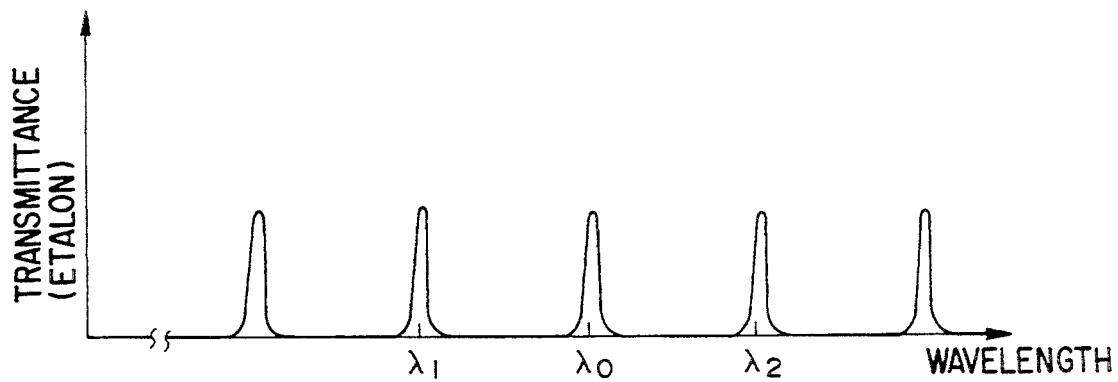
F I G. 11
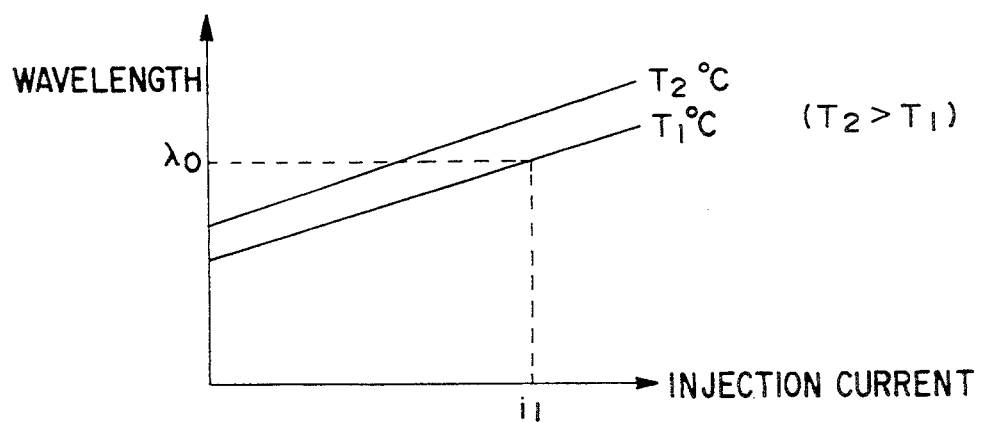
F I G. 12

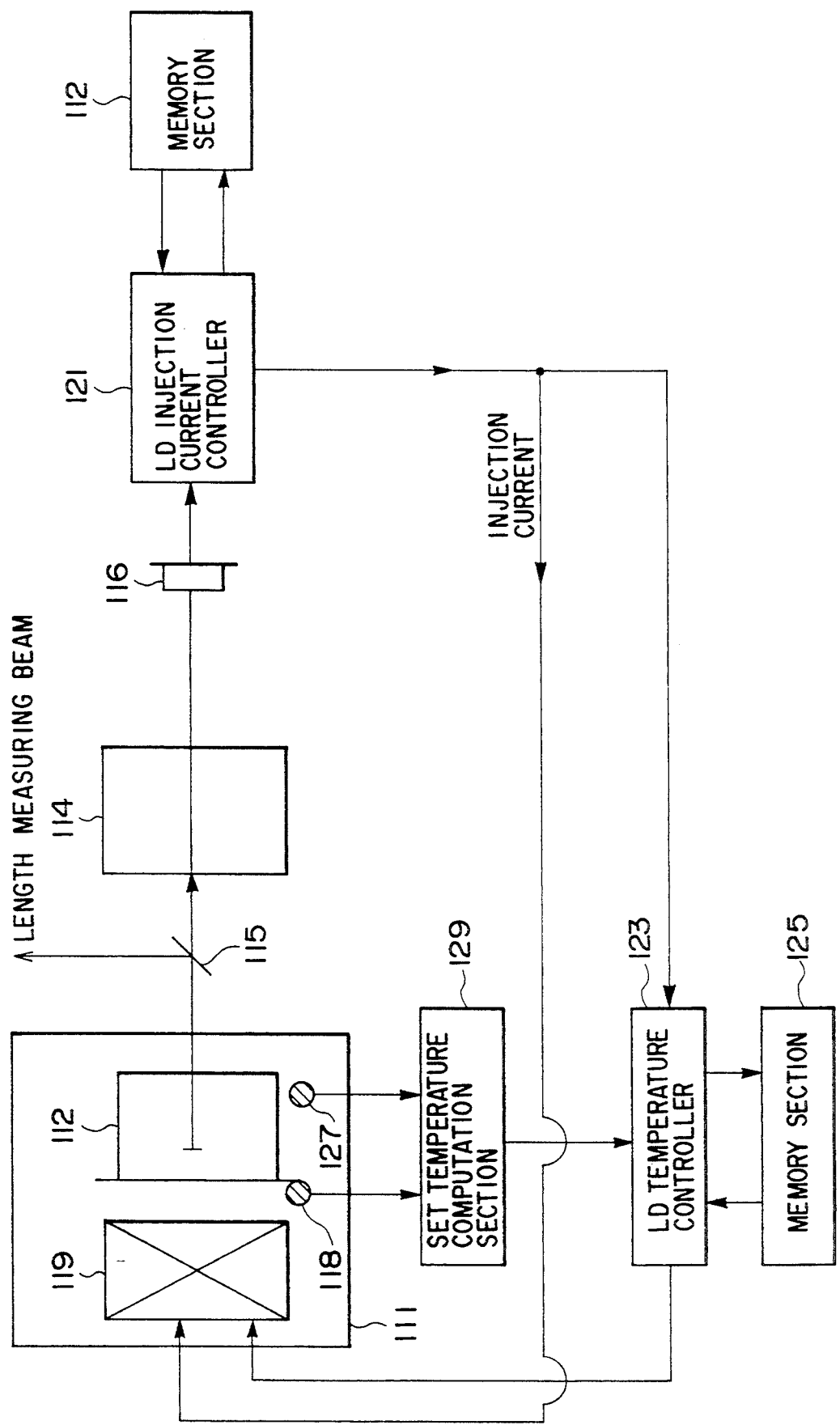
F I G. 14

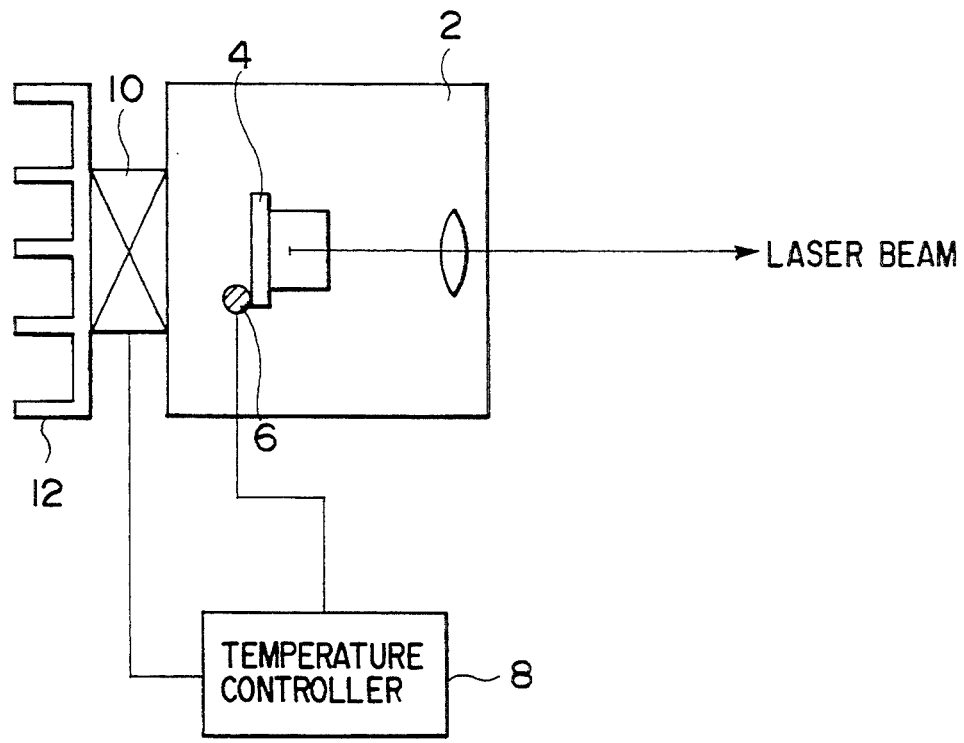
F I G. 15
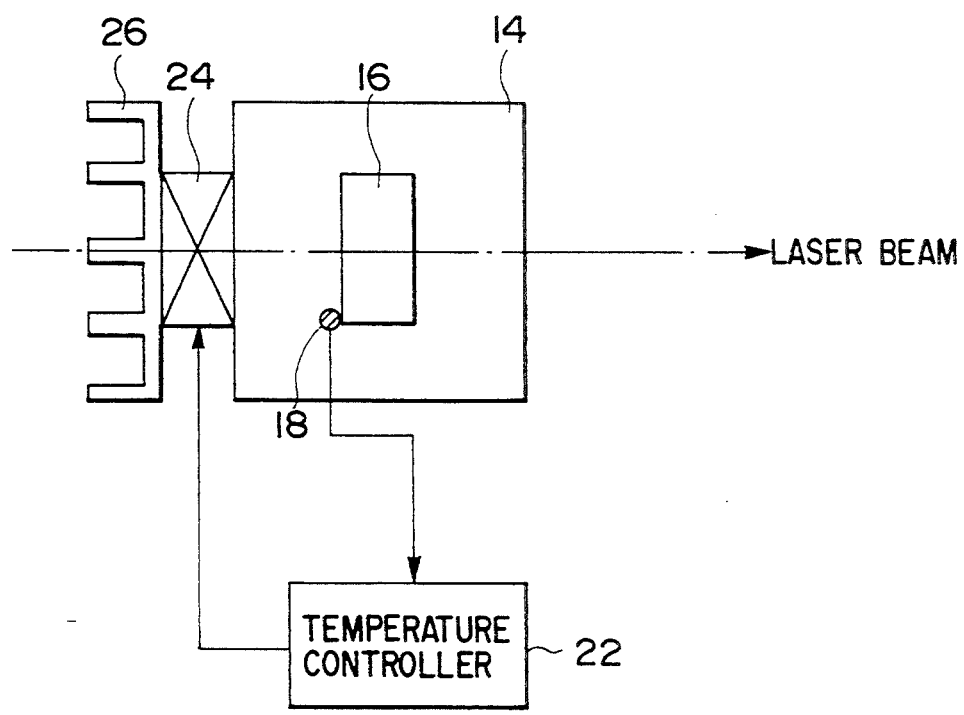
F I G. 16

WAVELENGTH STABILIZING APPARATUS

TECHNICAL FIELD

The present invention relates to a wavelength stabilizing apparatus for stabilizing the wavelength of laser light exiting, for example, from a semiconductor laser.

BACKGROUND ART

It has been conventionally known that the oscillation wavelength of a semiconductor laser (hereinafter referred to merely as an LD) greatly varies due to a slight temperature variation and injection current variation.

It has been proposed that, by making injection current control and temperature control while regulating a wavelength reference with the use of the Fabry-Perot resonator having a periodic transmission spectral characteristic, the oscillation wavelength of LD is locked to a predetermined mode of the Fabry-Perot resonator so that the oscillation wavelength is stabilized.

At that time, in view of the necessity to oscillate LD near the predetermined mode of the Fabry-Perot resonator it is necessary to stabilize the temperature of LD as the pre-process of the wavelength stabilization. Further it is necessary to stabilize the temperature of the Fabry-Perot so as to obtain the characteristic of a stabilized transmission spectral characteristic.

In order to stabilize the temperature of an LD 4 provided in an LD resonator 2, an LD temperature sensor 6 is provided near LD 4, as shown in FIG. 15, so as to detect the temperature of LD 4. Based on a temperature detection signal output from the LD temperature sensor 6, a temperature controller 8 controls a drive current in a Peltier element 10 so that the temperature of LD 4 is maintained at a predetermined temperature. It is to be noted that a fin member 12 for heat dissipation is provided at a Peltier element 10.

As shown in FIG. 16 in the neighborhood of a solid type etalon 16 provided in an etalon holder 14, an etalon temperature sensor 18 for detecting the temperature of the etalon 16 is provided so as to stabilize the temperature of the Fabry-Perot resonator. A temperature detection signal is output from the etalon temperature sensor 18 and, based on the temperature detection signal, a temperature controller 22 controls a drive current in a Peltier element 24 so that the temperature of the etalon 16 is maintained at a predetermined level. It is also to be noted that the Peltier element 24 is equipped with a fin element 26 for heat dissipation.

The following two conditions are required to achieve the wavelength stabilization of LD.

(1) LD is oscillated in the neighborhood of a predetermined mode of the Fabry-Perot resonator.

(2) A Fabry-Perot resonator is achieved which has a stabilized reference without being susceptible to an influence from an ambient temperature variation.

The conventional method poses the problem that, if the ambient temperature varies even in the case where the temperature of LD is stabilized, it is difficult to oscillate LD near the Fabry-Perot resonator (the problem encountered due to the ambient temperature variation). Further, there is also the problem that the LD's wavelength, though slightly with the passage of time, drifts even if the injection current and temperature are constant (the problem encountered with the passage of time).

Explanation will be given below about the following two problems.

<The Problem Encountered From the Ambient Temperature Variation>

As shown in FIGS. 15 and 16, the LD temperature sensor 6 and etalon temperature sensor 18 do not have their measuring points aligned with the mounting positions of LD 4 and etalon 16, problems as set out below arise in the case where ambient temperature in LD 4 and etalon 16 varies in the LD holder 2 and etalon holder 14, respectively.

The problem under consideration will be explained below with reference to FIG. 17. In FIG. 17, the abscissa denotes a thermal resistive value with the position of the LD temperature sensor 6 (etalon temperature sensor 18) set as a reference and the ordinate, the temperature involved.

As shown in FIG. 17, the temperature ($T_A$) of the LD temperature sensor 6 (etalon temperature sensor 18) is stabilized to the set reference level ($T_{A0}$) and, at that time, the temperature ($T_L$) of LD 4 (etalon 16) and ambient temperature ($T_B$) are assumed to be on the solid line in FIG. 17.

Now let it be assumed that the ambient temperature ($T_b$) is lowered. Since normal operation is involved under temperature control, the LD temperature 6 (etalon temperature sensor 18) is held at the set reference level ($T_{A0}$).

In actual practice, however, LD 4 (etalon 16) will be stabilized to a temperature lower by $\Delta T_L$ than the temperature ($T_L$).

FIG. 18 shows a corresponding temperature control flow. The temperature ($T_A$) is detected with an LD temperature sensor 6 (etalon temperature sensor 18)-S1. Based on that temperature detection signal, the temperature controllers 8, 22 compute a deviation ($\Delta$) from the set reference temperature ($T_{A0}$)-S2. A Peltier current ($I_{PL}$) is computed from that calculated value-S3 and a drive current in the Peltier elements 10, 24 is controlled-S4. In FIG. 18, P denotes a proportional coefficient; I, an integral coefficient; and D, a derivative coefficient.

From this, the following defects arise.

First, LD 4 oscillates with a wavelength greatly deviated from a predetermined mode of the etalon 16, that is, a wavelength reference, due to the variation of the ambient temperature. As a result, it is not possible to achieve the locking of the wavelength involved or the wavelength will fail to be locked to other modes.

Second, the spectral characteristic of the etalon 16, that is, the wavelength reference, will be varied due to the variation of the ambient temperature.

<The Problem Encountered With the Passage of Time>

The oscillation wavelength of LD varies with the passage of time as shown in FIG. 19 (OPTRONICS (1992) No. 11 [Feature of LD Heterodyne Light Source and How to Use It]; YAMAURA, ISHIBAI, HIRANO—HOYA Co. Ltd. That is, a straight line as shown in FIG. 12 varies with the passage of time and the oscillation wavelength of LD is deviated from $\lambda_0$ even if the temperature of LD is $T_1$ (° C.) and injection current of LD is il. As a result, even if the temperatures of LD and injection current of LD are set to a predetermined value, a desired oscillation wavelength fails to be obtained and the wavelength involved can be locked to a different wavelength.

The present invention is achieved so as to solve these problems. It is accordingly the object of the present invention to provide a wavelength stabilizing apparatus for stabilizing an oscillation wavelength without being affected due to a variation of ambient temperature and a variation of an LD with the passage of time.

DISCLOSURE OF INVENTION

A wavelength stabilizing apparatus of the present invention comprises:

an electric current supply source for supplying a given injection current;

a semiconductor laser for receiving the injection current from the electric current supply source to output a laser beam;

a wavelength distinguishing element for distinguishing a wavelength of the laser beam which is output from the semiconductor laser;

a photodetector for detecting an intensity of the output laser beam from the wavelength distinguishing element; and a temperature controller for performing temperature control of the semiconductor laser so as to enable the output of the photodetector to become a predetermined value and for, when the output of the photodetector becomes that predetermined value, reserving a corresponding semiconductor laser temperature and, at a start of the next temperature control, initializing temperature control based on a finally reserved temperature of the semiconductor laser.

Further, a wavelength stabilizing apparatus of the present invention comprises:

an electric current supply source for supplying a given injection current;

a semiconductor laser for receiving the injection current from the electric current source and outputting a laser beam;

a wavelength distinguishing element for distinguishing a wavelength of the laser beam which is output from the semiconductor laser;

a photodetector for detecting an intensity of the output laser beam from the wavelength distinguishing element;

a temperature controller for performing temperature control of the semiconductor laser so as to enable the output of the photodetector to become a predetermined value; and alarm means for making comparison between a predetermined initializing temperature of the semiconductor laser and a present temperature of the semiconductor laser and, for, when a difference between the initializing temperature and the temperature of the semiconductor laser exceeds a predetermined value, delivering an alarm output.

Further, a wavelength stabilizing apparatus of the present invention comprises:

a wavelength distinguishing element for distinguishing a wavelength of a laser beam which is output from a semiconductor laser, a photodetector for detecting an intensity of the output laser beam from the wavelength distinguishing element, an injection current controller for controlling an injection current, which is supplied to the semiconductor laser, so as to enable the output of the photodetector to become a predetermined value, and a temperature controller for performing temperature control so as to enable the semiconductor laser to become a set temperature, the apparatus further comprising:

an injection current controller for, when the output of the photodetector becomes a predetermined value, reserving a corresponding injection current value and, at a start of controlling the next injection current, initializing control based on a finally reserved injection current value of the semiconductor laser.

Further, a wavelength stabilizing apparatus of the present invention comprises:

a wavelength distinguishing element for distinguishing a wavelength of a laser beam which is output from a semiconductor laser, a photodetector for detecting an intensity of the output laser beam from the wavelength distinguishing element, an injection current controller for controlling an injection current, which is supplied to the semiconductor laser, so as to enable the output of the photodetector to become a predetermined value, and a temperature controller for performing temperature control so as to bring the semiconductor laser to a set temperature, the apparatus further comprising:

alarm means for making comparison between a predetermined initial injection current value of the semiconductor laser and a present supply injection current and for, when a difference between the initial injection current value and the present supply injection current exceeds a predetermined value, delivering an alarm output.

Further, a wavelength stabilizing apparatus of the present invention comprises:

a semiconductor laser;

a wavelength distinguishing element for distinguishing a wavelength of a laser beam which is output from the semiconductor laser;

a photodetector for detecting an intensity of the output laser beam from the wavelength distinguishing element;

a temperature controller for reserving a temperature of the semiconductor laser and, at the next temperature control time, initiating temperature control based on a finally reserved temperature of the semiconductor laser; and an injection current controller for reserving the injection current value of the semiconductor laser and, at the next injection control start time, initiating control based on a finally reserved injection current value of the semiconductor laser.

Further, a wavelength stabilizing apparatus of the present invention comprises:

an electric current supply source for supplying an injection current;

a semiconductor laser for receiving the injection current from the electric current supply source;

a temperature sensor for detecting a temperature of the semiconductor laser;

heating/cooling means for heating or cooling the semiconductor laser;

an ambient temperature sensor for detecting an ambient temperature around the semiconductor laser;

a control system for, based on a difference between the ambient temperature detected by the ambient temperature sensor and an initially defined reference ambient temperature, computing a set temperature obtained with a correction applied to the reference set temperature of the temperature sensor; and a temperature controller which, in order to stabilize the temperature which is detected by the temperature sensor to the set temperature, operates the heating- /cooling means to enable the semiconductor laser to be heated or cooled.

Further, a wavelength stabilizing apparatus of the present invention comprises:

an electric current supply source for supplying an injection current;

a semiconductor laser for receiving the injection current from the electric current source and outputting a laser beam;

a temperature sensor for detecting a temperature of the semiconductor laser;

an ambient temperature sensor for detecting an ambient temperature around the semiconductor laser;

a wave distinguishing element for distinguishing a wavelength of the output laser beam from the semiconductor laser;

a photodetector for detecting an intensity of the output beam of the wavelength distinguishing element; and a temperature controller for, in order to bring the output of the photodetector to a predetermined value, performing temperature control of the semiconductor laser and, when the output of the photodetector becomes a predetermined value, reserving a corresponding detection temperature of the temperature sensor and corresponding detection temperature of the ambient temperature sensor and, at the next temperature control start time, initiating temperature control of the semiconductor laser with finally reserved detection temperatures of the temperature sensor and ambient temperature sensor as a reference set temperature of the the temperature sensor and reference ambient temperature of the ambient temperature sensor, respectively.

Further, a wavelength stabilizing apparatus of the present invention comprises:

a semiconductor laser;

a temperature sensor for detecting a temperature of the semiconductor laser;

an ambient temperature sensor for detecting an ambient temperature around the semiconductor laser;

a wavelength distinguishing element for distinguishing a wavelength of a laser beam which is output from the semiconductor laser;

a photodetector for detecting an intensity of the output laser beam from the wavelength distinguishing element;

a temperature controller for reserving the detection temperatures of the temperature sensor and ambient temperature sensor and, at the next temperature control start time, initiating temperature control of the semiconductor laser with finally reserved detection temperatures of the temperature sensor and ambient temperature sensor as a reference set temperature of the temperature sensor and reference ambient temperature of the ambient temperature sensor, respectively; and an injection current controller for reserving an injection current value of the semiconductor laser and, at the next injection current control time, initiating control based on a finally reserved injection current of the semiconductor laser.

Further, a wavelength stabilizing apparatus of the present invention comprises:

a wavelength distinguishing element providing a wavelength reference on which a wavelength of a semiconductor laser is stabilized;

a temperature sensor for detecting a temperature of the wavelength distinguishing element;

heating/cooling means for heating or cooling the wavelength distinguishing element;

an ambient temperature sensor for detecting an ambient temperature around the wavelength distinguishing element;

a control system for, based on a difference between an ambient temperature detected by the ambient temperature sensor and an initially defined reference ambient temperature, computing a set temperature obtained with a correction applied to a reference set temperature of the temperature sensor; and a control system for operating the heating/cooling means so as to stabilize the temperature which is detected by the temperature sensor to the set temperature and for heating or cooling the wavelength distinguishing element.

BRIEF DESCRIPTION OF THE DRAWINGS

FIG. 1 is a view showing a semiconductor laser light source unit of a wavelength stabilizing apparatus according to a first embodiment of the present invention;

FIG. 2 is a view showing a wavelength stabilizing unit of a wavelength stabilizing apparatus according to the first embodiment of the present invention;

FIG. 11 is a view showing a wavelength distinguishing characteristic provided to the wavelength stabilizing apparatus;

FIG. 12 is a view showing a relation of an injection electric current of a laser diode to its oscillation wavelength;

FIG. 14 is a view schematically showing an arrangement of a wavelength stabilizing apparatus according to a variant of the present invention;

FIG. 15 is a view showing part of an arrangement of a conventional laser beam exiting optical system;

FIG. 16 is a view showing part of an arrangement of the conventional laser beam exiting optical system;

BEST MODE OF CARRYING OUT THE INVENTION

Figure 3:
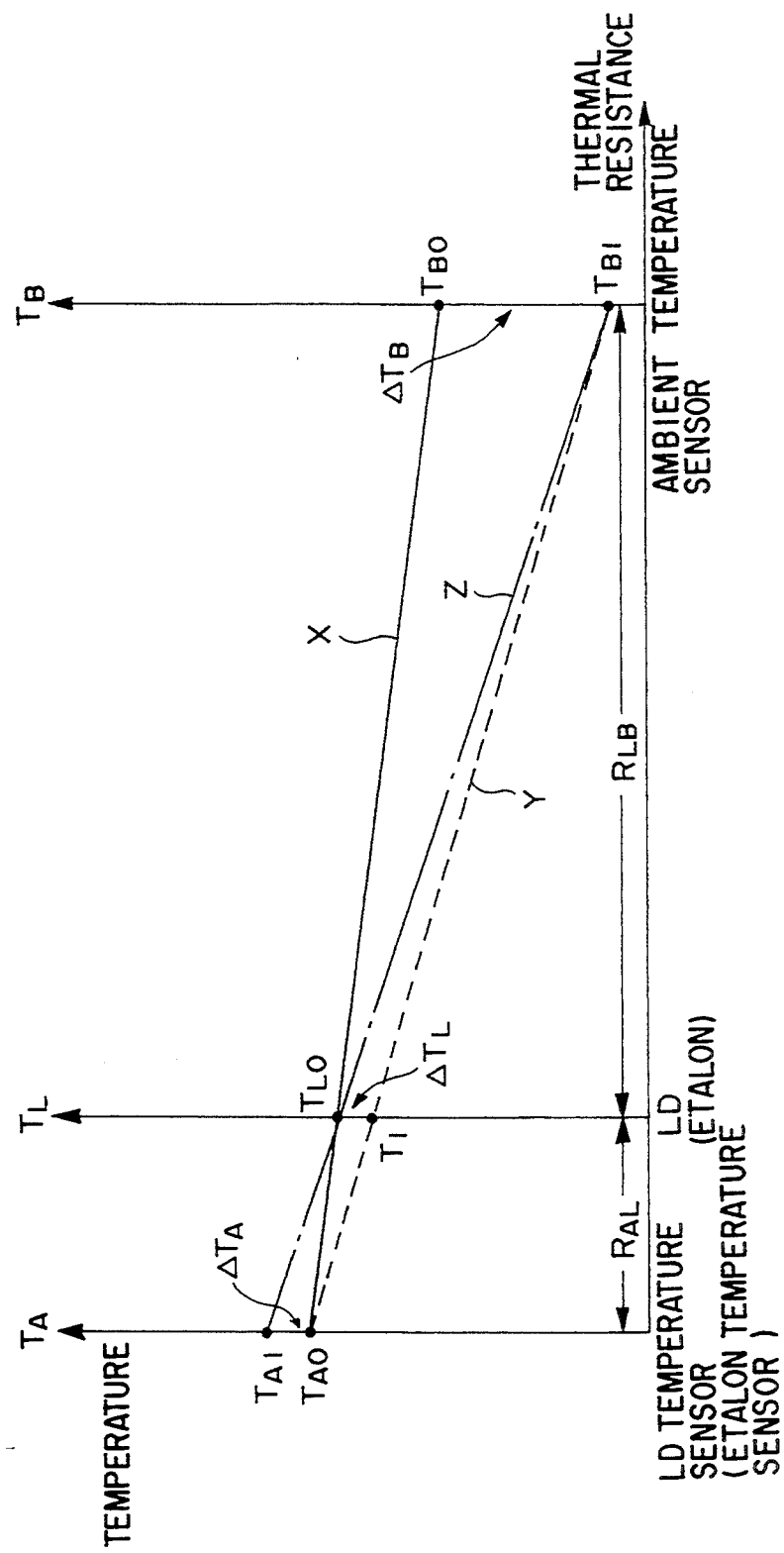
FIG. 3 is a view showing a thermal resistive value-to-temperature relation with the position of an LD temperature sensor (etalon temperature sensor) as a reference in the wavelength stabilizing apparatus according to the first embodiment of the present embodiment.

A wavelength stabilizing apparatus according to a first embodiment of the present invention will be explained below with reference to FIGS. 1 to 6.

As shown in FIGS. 1 and 2, a wavelength stabilizing apparatus of the present invention is provided in a semiconductor laser light source unit 28, comprised of a laser light exiting optical system, and a wavelength stabilizing unit 30.

As shown in FIG. 1, the semiconductor laser light source unit 28 comprises an LD holder 34 with an incorporated semiconductor laser (hereinafter referred merely as an "LD") 32 for allowing a predetermined laser beam to exit, a heating/cooling means, that is, a Peltier element 36, connected to an LD holder 34 and adapted to heat or cool LD 32, and a fin element connected to the Peltier element 36 so as to dissipate heat.

In the LD holder 34 are provided an LD temperature sensor 40 for detecting temperature near LD 32 and an ambient temperature sensor 42 for detecting ambient temperature around LD 32.

The LD temperature sensor 40 and ambient temperature sensor 42 are electrically connected to a temperature controller 46 via a set temperature computation section 44 and, based on an input signal, the temperature controller 46 controls a drive current in the Peltier element 36 to maintain the temperature of LD 32 at a predetermined level.

As shown in FIG. 2, the wavelength stabilizing unit 30 includes an etalon holder 50 with a built-in etalon 48 for allowing the transmission of laser light with a predetermined oscillation mode, a heating/cooling means, that is, a Peltier element 52, connected to the etalon holder 50, and adapted to heat or cool the etalon 48, and a fin element 54 connected to the Peltier element 52 to dissipate heat.

In the etalon holder 50 are provided an etalon temperature sensor 56 for detecting temperature near the etalon 48 and an ambient temperature sensor 58 for detecting ambient temperature around the etalon 48.

The etalon temperature sensor 56 and ambient temperature sensor 58 are electrically connected to a temperature control section 62 via a set temperature computation section 60. Based on an input signal, the temperature controller 62 controls a drive current in the Peltier element 52 to maintain the temperature of the etalon 48 at a predetermined level.

Let it be assumed that, in the case where a temperature ($T_A$) of the LD temperature sensor 40 (etalon temperature sensor 56) is stabilized to a predetermined set reference level ($T_{A0}$), a temperature ($T_B$) of the ambient temperature sensors 42, 58 is at a predetermined set ambient level ($T_{B0}$) as shown in FIG. 3 where a solid line X denotes its relation. At this time, a temperature ($T_L$) of LD 32 (etalon 48) is at a level ($T_{L0}$).

Thereafter, the ambient temperature is lowered and, when the temperature ($T_{B0}$) of the ambient temperature sensors 42, 58 is lowered by $\Delta T_B$ to a level ($T_{B1}$), the temperature ($T_A$) of the LD temperature sensor 40 (etalon temperature sensor 56) is held at the aforementioned set reference level ($T_{A0}$) because the temperature control is acting.

As a result, the solid line X has its gradient varied to a state, as indicated by a dash line Y, with the set reference temperature ($T_{A0}$) as a fulcrum. For this reason, the temperature ($T_L$) of LD 32 (etalon 48) is varied from the level ($T_{L0}$) by $\Delta T_L$ to a level ($T_{L1}$).

The temperature ($T_L$) of LD 32 (etalon 48) can be returned back to an initial level ($T_{L0}$) by raising the temperature ($T_A$) of the LD temperature sensor 40 (etalon temperature sensor 56) by $\Delta T_A$ to the level ($T_{A1}$) to shift the dash line Y to a state as indicated by a dot-dash line Z.

According to that principle as set out above, the oscillation wavelength of the laser light can be stabilized by varying the temperature of the LD temperature sensor 40 (etalon temperature sensor 56) so as to correspond to the variation of the ambient temperature.

An explanation will be given below of a method for stabilizing the wavelength on the wavelength stabilizing apparatus of the present embodiment to which such principle is applied.

With $R_{AL}$ representing a thermal resistance between the LD temperature sensor 40 (etalon temperature sensor 56) and the LD 32 (etalon 48) and $R_{LB}$, a thermal resistance between LD 32 (etalon 48) and the ambient temperature sensors 42, 58, an area bounded by those points ($T_{L0}$, $T_{A1}$, $T_{A0}$) has a similarity to an area bounded by the points ($T_{L0}$, $T_{B1}$, $T_{B0}$), assuming $R_{AL}:R_{LB}=1:50$, so that $$\Delta T_A : \Delta T_B = -1:50$$

Hence, $$\Delta T_A = (-1/50)\Delta T_B.$$

By correcting $\Delta T_A$ with respect to the set reference temperature ($T_{A0}$) of the LD temperature sensor 40 (etalon temperature sensor 56) so that temperature stabilization is achieved, it is possible to hold the temperature of LD 32 (etalon 48) almost at a level ($T_{L0}$). That is, the set temperature ($T_{A1}$) of the LD temperature sensor 40 (etalon temperature sensor 56) becomes $$\begin{aligned}T_{A1} &= T_{A0} - \{(R_{AL}/R_{LB}) \times (T_{B1} - T_{B0})\} \\ &= T_{A0} - \{(1/50) \times (T_{B1} - T_{B0})\}.\end{aligned}$$

By stabilizing the LD temperature sensor 40 (etalon temperature sensor 56) to that temperature ($T_{A1}$) as found by the aforementioned equation, it is possible to hold the temperature of LD 32 (etalon 48) nearly constant without affecting the variation of the ambient temperature.

Figure 4:
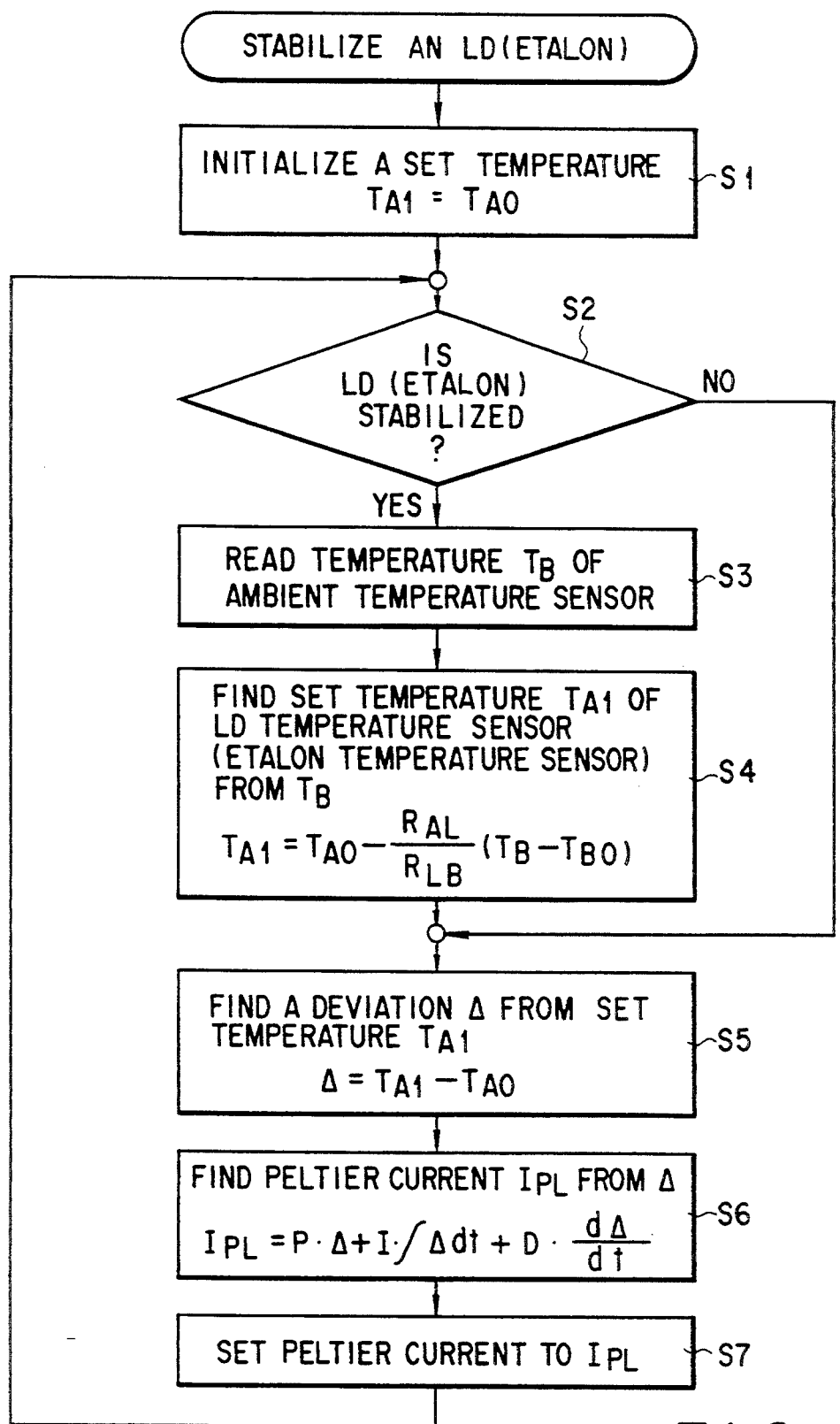
FIG. 4 is a view showing a temperature control flow when an LD (etalon) temperature is stabilized in the wavelength stabilizing apparatus according to the first embodiment of the present invention.

FIG. 4 shows a practical operation flow of the aforementioned method.

As shown in FIG. 4, the temperature ($T_A$) of the LD temperature sensor 40 (etalon temperature sensor 56) is initialized to a predetermined set reference level ($T_{A0}$) at step S1. A signal output from the LD temperature sensor 40 (etalon temperature sensor 56) is input to the temperature controller 46 (62) via the set temperature computation section 44 (60) and detection is made as to whether or not the temperature ($T_L$) of LD 32 (etalon 48) is stabilized to a predetermined level ($T_{L0}$) at step S2.

If the temperature above is detected as being stabilized, the corresponding ambient temperature ($T_B$) is detected by the ambient temperature sensor 42 (58) at step S3.

The detected temperature ($T_B$), being converted by the ambient temperature sensor 42 (58) to a temperature signal, is output via the set temperature computation section 44 to the temperature controller 46 (62). During that time, a computation $$T_{A1} = T_{A0} - (R_{AL}/R_{LB}) \times (T_B - T_{B0})$$

is performed and the set temperature ($T_{A1}$) of the LD temperature sensor 40 (etalon temperature sensor 56) is computed at step S4, and a deviation $\Delta(T_{A1} - T_{A0})$ from the set reference temperature ($T_{A0}$) is computed at step S5. A Peltier current value ($I_{PL}$) at which the Peltier element 36 (52) is driven is found based on the computed deviation $\Delta$ at step S6 and the value is set at step S7. At step S6, P, I and D represent a proportional, an integral and a derivative coefficient.

The temperature control section 46 (62) controls the Peltier element 36 (52) on the basis of the Peltier current ($I_{PL}$) corresponding to the set value and enables LD 32 (etalon 48) to be heated or cooled so that the LD temperature sensor 40 (etalon temperature sensor 56) reaches a set temperature.

According to the wavelength stabilizing apparatus of the present embodiment, the LD temperature sensor 40 (etalon temperature sensor 56) is maintained to the aforementioned set temperature ($T_{A1}$) and, by so doing, it is possible to hold the temperature of LD 32 (etalon 48) constant without being affected by a change in the ambient temperature.

Figure 5:
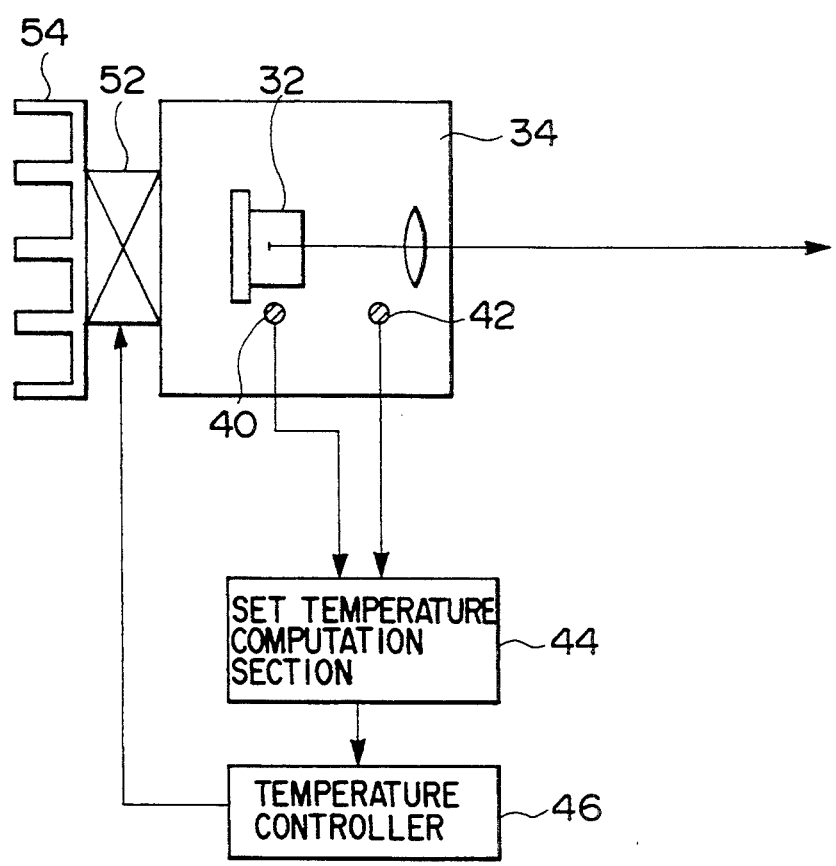
FIG. 5 is a view showing another form of the semiconductor laser light source unit shown in FIG. 1.

Although, in the aforementioned arrangement, LD 32 is arranged at an internally divided point between the sensor 42 and the LD temperature sensor 40, the present invention is not restricted thereto. The LD 32 can be located, for example, at an externally divided point as shown in FIG. 5. The thermal resistance and temperature in this case have a relation as shown in FIG. 6.

Figure 6:
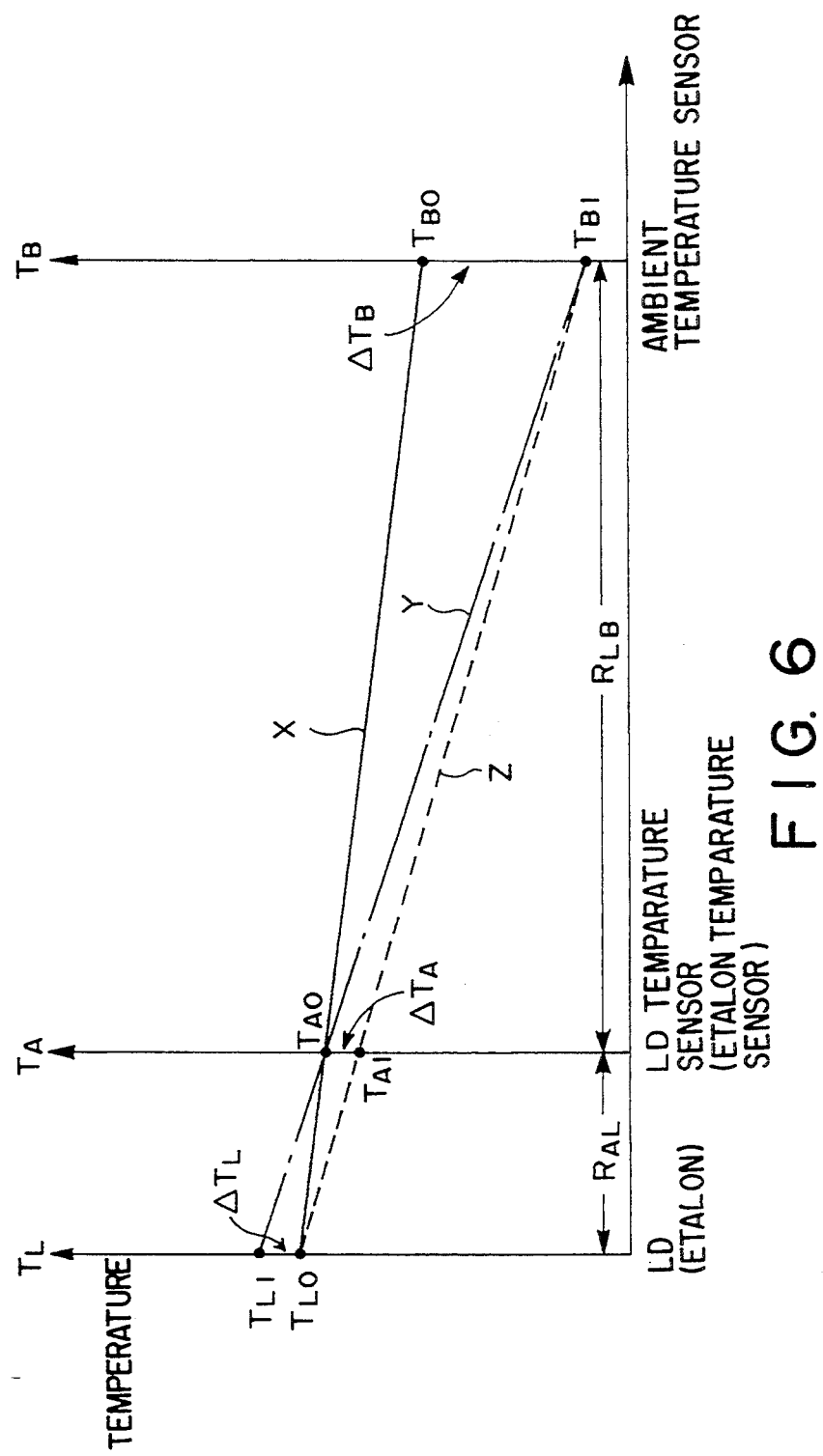
FIG. 6 is a view showing a thermal resistive value-to-temperature relation in the apparatus shown in FIG. 5.

Now let it be assumed that, in the case where the temperature ($T_A$) of an LD temperature sensor 40 (etalon temperature sensor 56) is stabilized at a predetermined set reference level ($T_{A0}$) as shown in FIGS. 5 and 6, the temperature ($T_B$) of ambient temperature sensor 42, 58 is at a predetermined set ambient temperature ($T_{B0}$)—This relation is shown by a solid line X. At this time, the temperature ($T_L$) of LD 32 (etalon 48) is at a level ($T_{L0}$).

At a subsequent time, when the ambient temperature is lowered, the temperature ($T_A$) of the LD temperature sensor 40 (etalon temperature sensor 56) is held at the aforementioned set reference level ($T_{A0}$) because temperature control is acting. As a result, the solid line X has its gradient varied to a state, as indicated by a dot-dash line Y, with the set reference temperature ($T_{A0}$) as a fulcrum. For this reason, the temperature ($T_L$) of LD 32 (etalon 48) is varied by $\Delta T_L$ from the temperature level ($T_{L0}$) to the temperature level ($T_{L1}$).

There, the temperature ($T_A$) of the LD temperature sensor 40 (etalon temperature sensor 56) is lowered by $\Delta T_A$ to a level ($T_{A1}$) to bring the dot-dash line Y to be shifted to a dot line Z and, by so doing, it is possible to return the temperature ($T_L$) of LD 32 (etalon 48) back to the initial level ($T_{L0}$).

At this time, the set temperature ($T_{A1}$) of the LD temperature sensor 40 (etalon temperature sensor 56) so corrected as to correspond to the variation of the ambient temperature becomes $$T_{A1} = T_{A0} + (R_{AL}/R_{LB}) \times (T_B - T_{B0}).$$

Based on the result of computation, the Peltier current value is found and the Peltier element 36 (52) is drive-controlled and the temperature of LD 32 (etalon 48) is stabilized.

Then the wavelength stabilizing apparatus according to a second embodiment of the present invention will be explained below with reference to FIG. 7. In the explanation of the present embodiment, the same reference numerals are employed to designate those component parts of similar structure to the aforementioned embodiment and further explanation of them is omitted.

Figure 7:
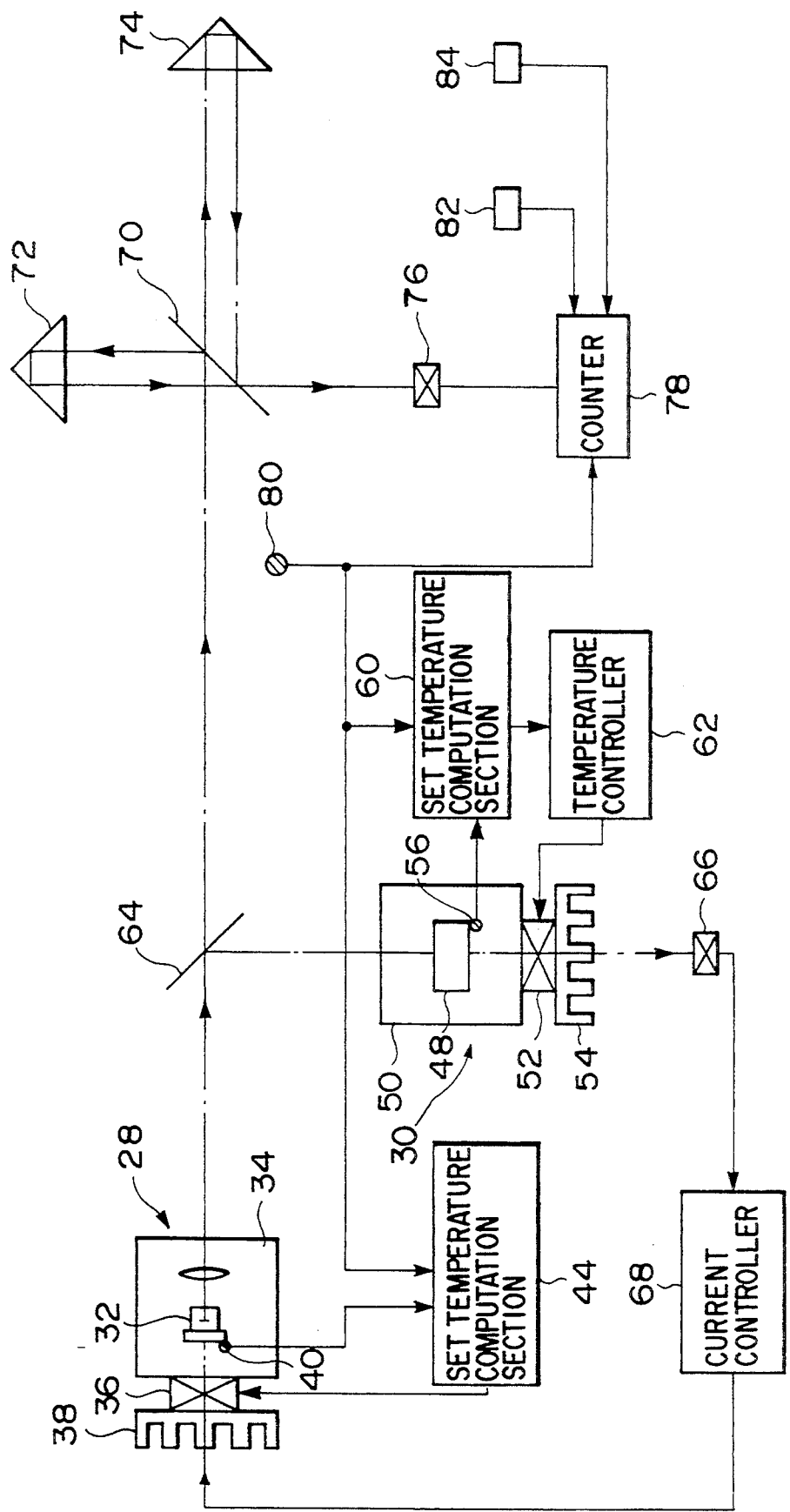
FIG. 7 is a view showing a wavelength stabilizing apparatus, according to a second embodiment of the present invention, which is applied to an interference length measuring apparatus.

As shown in FIG. 7, the wavelength stabilizing apparatus of the present embodiment is applied to an interference length measuring apparatus and a wavelength stabilizing unit 30 is provided so as to stabilize, to a predetermined oscillation mode, the wavelength of laser light exiting from a semiconductor laser light source unit 28 serving as a light source.

An LD temperature sensor 40 is provided in the semiconductor laser light source unit 28 to detect temperature in the neighborhood of an LD 32 and, in order to maintain the temperature of LD 32 at a predetermined level, a temperature detection signal output from the LD temperature sensor 40 is delivered to a Peltier element 36 via a set temperature computation section 44.

An etalon temperature sensor 56 is provided in the wavelength stabilizing unit 30 so as to detect temperature near an etalon 48. In order to maintain the temperature of the etalon 48 at a predetermined level, a temperature detection signal output from an etalon temperature sensor 56 is delivered to a Peltier element 52 via a set temperature computation section 60 and temperature controller 62.

As will be set out below, an atmospheric temperature sensor 80 for refractive index correction, which serves as an ambient temperature sensor, is connected to corresponding set temperature computation sections 44 and 60. The ambient temperature around the semiconductor laser light source unit 28 and wavelength stabilizing unit 30 is detected by the atmospheric temperature sensor 80 at all times.

In such an arrangement, laser light exiting from the semiconductor laser light source unit is split by a first beam splitter 64 into two directional light beams, one of which is reflected by the first beam splitter 64 and illuminates a first photodetector 66 past the wavelength stabilizing unit 30. From the first photodetector 66, an electric signal is delivered as an output corresponding to an amount of light received. The electric signal is fed to a current controller 68, thereby controlling that electric current which is injected into LD 32.

The other laser beam after being transmitted through the first beam splitter 64 is sent to a second beam splitter 70 which splits it further into two directional laser beams.

Of the two directional laser beams, one is reflected by the second beam splitter 70 and, after being reflected by a reference mirror 72, directed again to the second beam splitter 70 for illumination. The other laser beam, after being transmitted through the second beam splitter 70, is directed to a measuring mirror 74 and again sent back to the second beam splitter 70 for illumination.

An interference beam is provided by a combination with the laser beam sent back to the second beam splitter 70 after traveling past the reference mirror 72 and measuring mirror 74. The interference beam is directed to a second photodetector 76 for illumination.

The interference beam directed to the second photodetector 76 is converted to an interference signal and then the interference signal is output to a counter 78.

Generally, the interference length measuring apparatus is often used in air and, in order to enhance the accuracy with which length measuring is made, it is necessary to find the refractive index of air and convert it to the wavelength of a laser beam in air.

Finding the refractive index of air can be achieved by several known methods, the simplest one of which comprises measuring the atmosphere temperature, atmospheric pressure humidity, individually, and finding the refractive index through the substitution of these data into an associated dispersion equation, such as the Edlen equation.

To this end, not only the interference signal from the second photodetector 76 but also the signals from the atmospheric temperature sensor 80, atmospheric pressure sensor 82 and humidity sensor 84 for the aforementioned refractive index correction are input to a counter 78. The counter 78 corrects the refractive index on the basis of these respective signals.

According to the apparatus of the present embodiment, the atmospheric temperature sensor 80 normally provided in the interference length measuring apparatus serves also as an ambient temperature sensor and, without the need to provide any extra new ambient temperature sensor, detects the ambient temperature around LD 32 and etalon 48 so that it is possible to vary the temperature at the LD temperature sensor 40 and etalon temperature sensor 56 corresponding to an ambient temperature variation and hence to stabilize the oscillation wavelength of the laser light involved.

A wavelength stabilizing apparatus according to a third embodiment of the present invention will be explained below with reference to FIG. 8.

Figure 8:
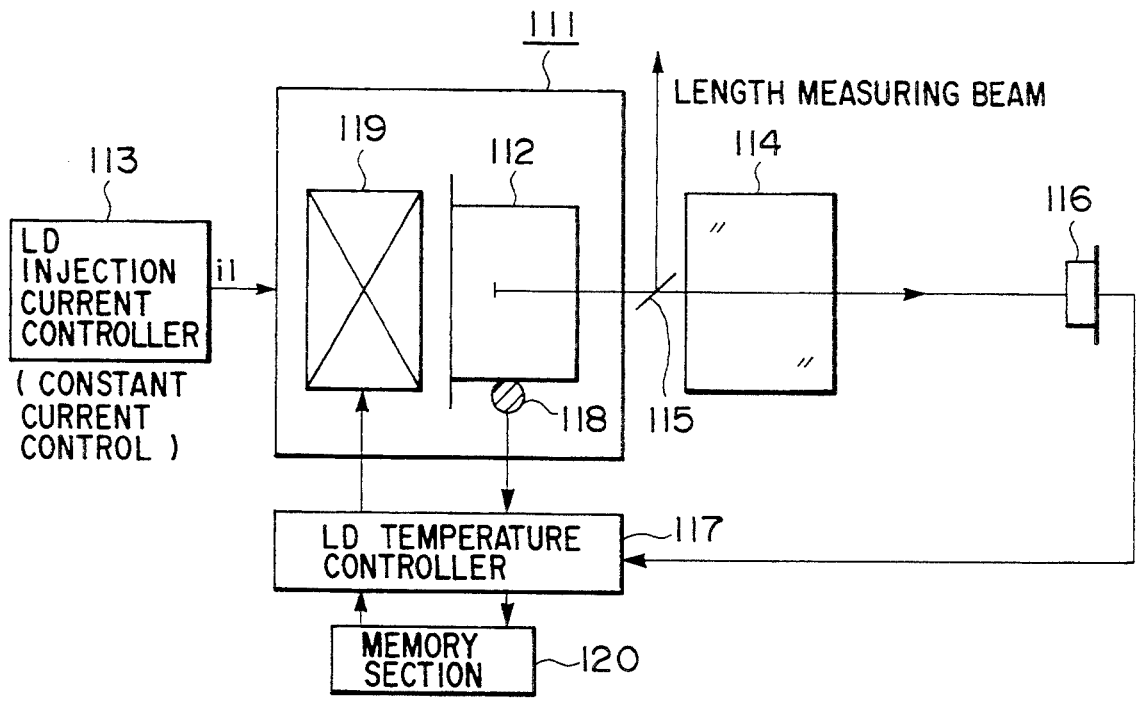
FIG. 8 is a view schematically showing an arrangement of a wavelength stabilizing apparatus according to a third embodiment of the present invention.

As shown in FIG. 8, an LD 112 is held within a light source section 111 and has a characteristic as shown in FIG. 12.

An injection current il held at a constant value is supplied to LD 112 from an LD injection current controller 113.

Laser light output from LD 112 is sent to a beam splitter 115 where it is branched. Of the branched beams, one beam is incident on an etalon 114 serving as a wavelength distinguishing element and the other beam is guided, as a length measuring light, to a length measuring optical system, not shown.

The beam passed through etalon 114 is incident on a PD 116 serving as a photodetector and the output of PD 116 is input to an LD temperature controller 117.

The temperature at LD 112 is detected by a thermistor 118 and input to the LD temperature controller 117. A memory section 120 with an initializing temperature level stored therein is connected to the LD temperature controller 117.

At the start of temperature control, the LD temperature controller 117 performs temperature control on the basis of the initializing temperature of the memory section 120 so that the temperature of LD 112 is set to an initializing temperature. Thereafter, the LD temperature controller 117 performs temperature control on the basis of the output of PD 116 so that a PD output becomes a predetermined set value or a peak value at all times.

In the present embodiment, an explanation will be made of an operation involved when the oscillation wavelength of LD 112 is stabilized to $\lambda_0$.

The LD injection current controller 113 performs constant current control at all times so that the injection current in LD 112 becomes a value il.

Based on the initializing set temperature stored in the memory section 120, the LD temperature control section 117 controls a current in a Peltier element 119 so as to set the detection temperature of the thermistor 118 to an initializing temperature. Thereafter, when the detection temperature of the thermistor 118 is nearly equal to the initializing temperature, the LD temperature controller 117 performs temperature control on the output of PD 116 without the initializing temperature.

In the case where the transmission characteristic of the etalon 114 is as shown in FIG. 11, the output of PD 116 becomes a peak value when the oscillation wavelength of LD 112 is equal to $\lambda_0$.

Therefore, the LD temperature controller 117 needs only to control temperature at LD 112 so as to enable the output of PD 116 to be maintained at a peak value at all times.

The temperature of LD 112 becomes deviated from T1(° C.) with a passage of time.

The detection temperature of the thermistor 118, upon temperature control by the LD temperature controller on the basis of an output of PD 116, is stored, in the memory section 120, as an initializing temperature when the next temperature control is performed, and this is updated.

When temperature control is next started, the updated value of the memory section 120 is controlled as an initializing temperature. That is, a temperature of LD 112 optimal to make the oscillation wavelength of LD 112 at a value $\lambda_0$ at that point in time is stored in the memory section 120.

According to the present invention, even if the oscillation wavelength of LD 112 with respect to the LD temperature T1(° C.) and injection current il is deviated from the value $\lambda_0$ with a time lapse variation of LD 112, it is possible to store, in the memory section 120, the LD temperature for obtaining a desired oscillation wavelength $\lambda_0$ and update it. It is possible to, at the next control start time, promptly set an optimal initial temperature corresponding to a present time variation and to stabilize it to a desired oscillation wavelength $\lambda_0$ at all times.

A wavelength stabilizing apparatus according to a fourth embodiment of the present invention will be explained below with reference to FIG. 9. In the explanation of the present embodiment, the same reference numerals are employed to designate parts of similar arrangement to the third embodiment and a corresponding explanation is omitted.

The present embodiment is characterized in that, with the LD temperature controlled to a predetermined state, an injection current in the LD is varied to correspond to a time lapse variation of LD and is stored.

Figure 9:
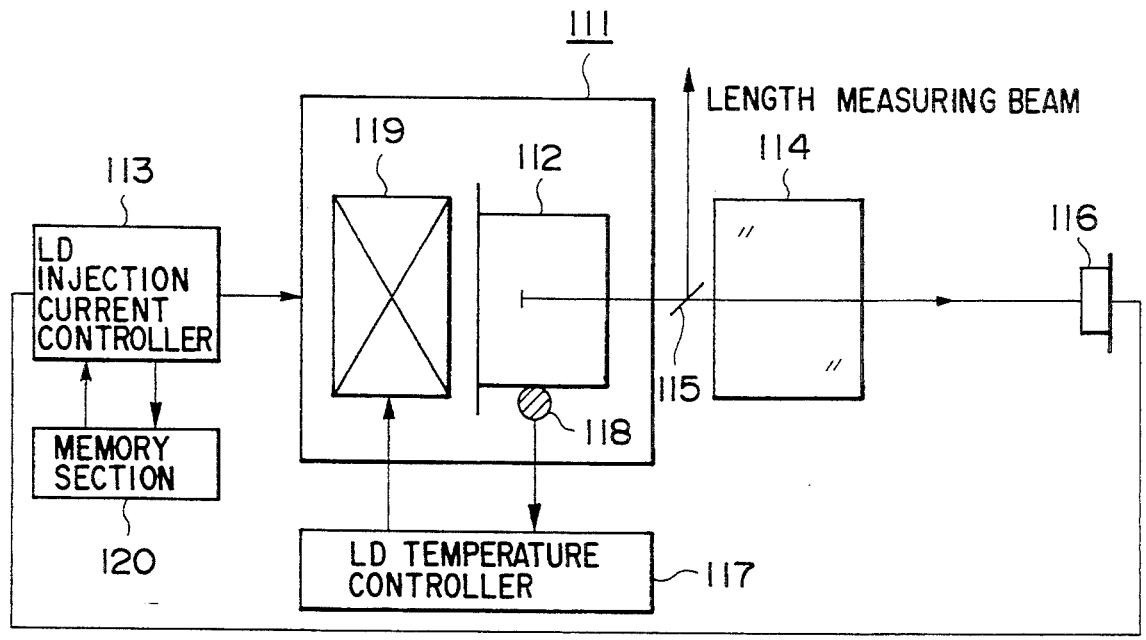
FIG. 9 is a view schematically showing a wavelength stabilizing apparatus according to a fourth embodiment of the present invention.

As shown in FIG. 9, a memory section 120 for storing an injection current value is connected to an injection current controller 113 and an output of a PD 116 is input to an injection current controller 113.

It is to be noted that an injection current value stored in the memory section 120 is a value at which, as in the LD temperature of the third embodiment, it is possible to obtain an oscillation wavelength $\lambda_0$ corresponding to a present time variation of LD 112.

Let it be assumed that, as in the third embodiment, LD 112 has a characteristic as shown in FIG. 12.

Further, an LD temperature controller 117 performs control such that, with a predetermined temperature set, the temperature of an LD 112 detected by a thermistor 118 becomes the set time.

An explanation will be made of an operation involved when the oscillation wavelength of LD 112 is stabilized to a value $\lambda_0$.

LD 112 is controlled by the LD temperature controller to a given temperature T1(° C.). That is, the LD injection current controller 113 controls an injection current in LD 112, on the basis of an initial injection current value stored in the memory section 120, so as to maintain the output of PD 116 at a peak level at all times.

The value of an injection current in LD at this time is deviated from a level i1 with a time lapsing variation of LD 112 although it should be near the level i1.

The value of the present current in LD is stored, in the memory section 120, as an initial injection current value involved when injection current control is next started and this is updated.

When the injection current is next started, control is performed with an updated value as the initial injection current value. That is, the memory section 120 stores an optimal injection current value, at the present point in time, at which the oscillation wavelength of LD 112 is stabilized to $\lambda_0$.

The advantages of the present embodiment are the same as in the aforementioned third embodiment and an explanation of it is omitted.

A wavelength stabilizing apparatus according to a fifth embodiment of the present invention will be explained below with reference to FIG. 10. In the explanation of this embodiment, the same reference numerals are employed to designate parts of similar structure to the third and fourth embodiments and the explanation of them is omitted.

Let it be assumed that an LD 112 has a characteristic as shown in FIG. 12.

In the wavelength stabilizing apparatus of the embodiment, an LD temperature controller 123 starts the temperature control of LD 112 on the basis of an initial set temperature value stored in a memory section 125. Thereafter, the LD temperature controller 123 is operated such that the LD temperature becomes a set temperature. Further, the injection current controller 121 starts supplying an injection current to LD 112 on the basis of an injection current value stored in a memory section 122.

After the injection current value of the memory section 122 has been set as an initial value, the LD injection current controller 121 monitors the output of a PD 116 and controls the injection current value so that the output of PD 116 is maintained to a peak value at all times. At this time, the memory content of the memory section 122 is sequentially updated by a controlled injection current value.

At this time, the value of the injection current supplied by the LD injection current controller 121 to LD 112 is output to the LD temperature controller 123.

In the case where the injection current value is varied beyond a given width, the LD temperature controller 123 varies the set temperature. That is, in order to correspond to a variation of the injection current which may be a factor for a wavelength variation, computation is made on the temperature variation of LD 112 or the temperature variation direction and the set temperature is varied based on the result of the computation.

The LD temperature controller 123 varies the set temperature on the basis of the injection current variation and the memory section 125 has its memory contents updated to a new set temperature. Sequentially, temperature control is performed based on a varied set temperature.

When the wavelength stabilizing apparatus of the present invention is to be operated again from a start, wavelength stabilizing control is started using, as an initial set value, memory contents finally stored in the memory.

According to the present embodiment, therefore, the oscillation wavelength of LD can be stabilized at all times to a desired wavelength so as to correspond to a broader time lapse variation than in the third and fourth embodiments. Further, operation can be started based on an initial set value (LD initial current value, LD set temperature) corresponding to a present time lapse variation of LD 112. It is possible to reduce the stabilization time and to suppress a laser beam power variation to a small extent.

According to the present embodiment, although the LD temperature control controller 123 performs given temperature control on the set temperature, the present embodiment is not restricted to the aforementioned arrangement in terms of its advantages.

The same effect can also be obtained even when the LD injection current controller 121 and LD temperature controller 123 serve to enable the output of PD 116 to become a predetermined value.

In the aforementioned third embodiment, fourth embodiment or a third/fourth embodiment combination, it is preferable that, with the injection current and set temperature's initial value stored at all times in place of sequentially updating the contents of the memory section, the LD injection current controller and LD temperature controller control the LD injection current value and LD temperature so as to enable the output of PD to become a predetermined value.

It is preferable that an alarming means equipped with a comparison function make comparison between the LD injection current value and LD set temperature's initial value in the memory section on one hand and the current injection current value and LD temperature on the other and, if their difference exceeds a threshold value, an alarm be delivered as an output for notifying a time lapse variation of LD.

According to such wavelength stabilizing apparatus, it is found very effective to know a replacement time of LD.

In the third embodiment through the fifth embodiment it is preferable to sequentially update the contents of the memory section and, at the same time, store the injection current and set temperature's initial value at all times, as set out above, and to make comparison, by a comparison function-equipped alarming means, between the injection current and set temperature's initial value on one hand and the present values on the other and, if their difference exceeds a given value, deliver an alarm as an output for notifying a time lapse variation of LD.

In this arrangement, as set out above, it is possible to know the displacement time of LD and, by eliminating an influence from the time lapse variation of LD, to stabilize a wavelength over a longer period of time.

Although explanation has been made about making preparation for a time lapse variation of LD which offers a major advantage, it is also possible according to the present invention to deal with a time lapse variation of a peripheral detection system of the LD temperature sensor (thermistor in the embodiment) and temperature sensor.

Although the etalon has been explained as being applied as a wavelength discriminating element, the same advantage as set out above is obtained using an absorption spectrum of atoms and molecules, diffraction grating, etc.

The present invention is not restricted to the aforementioned embodiment and various changes or modifications of the present invention is made without departing from the spirit and scope of the present invention.

Figure 13:
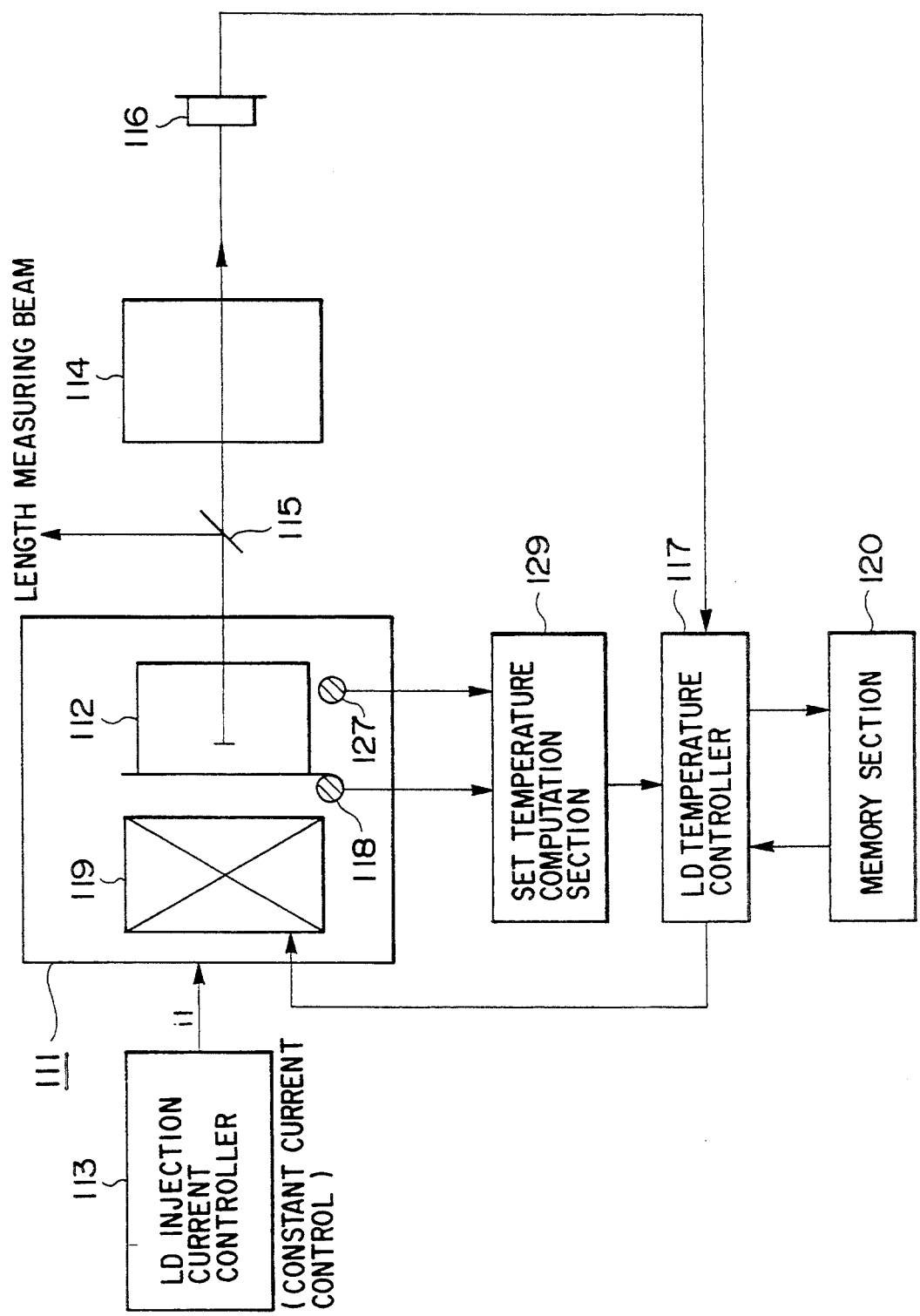
FIG. 13 is a view schematically showing an arrangement of a wavelength stabilizing apparatus according to a variant of the present invention.
Figure 17:
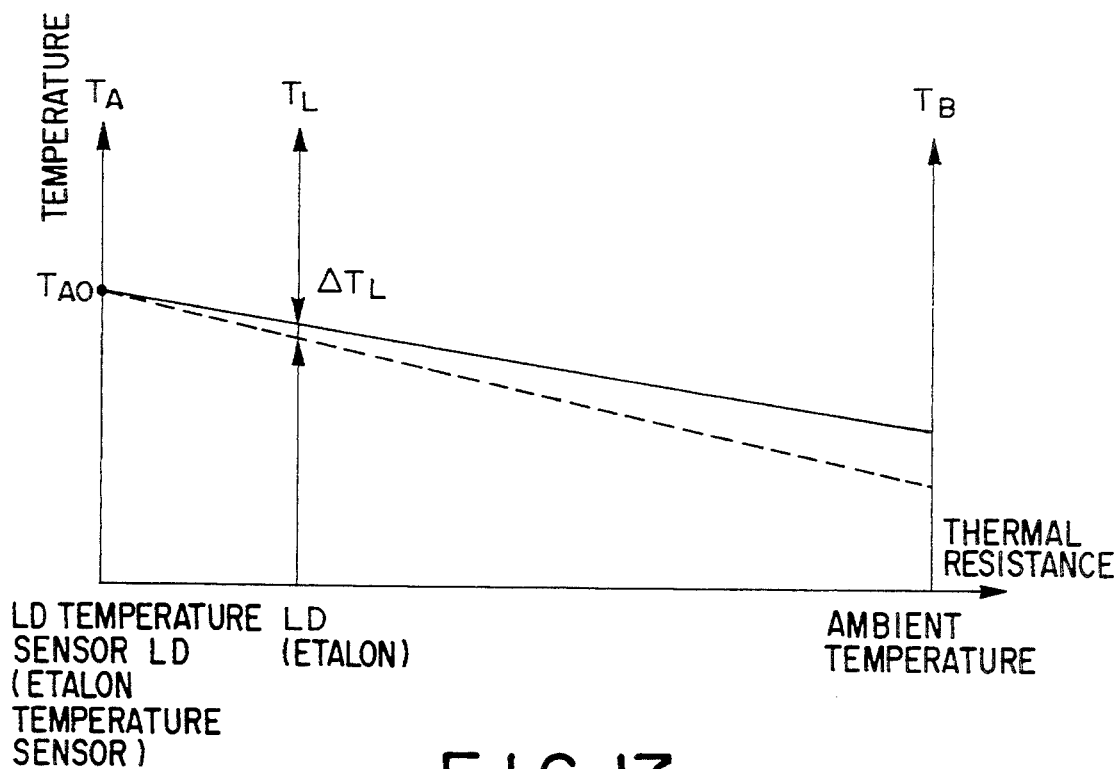
FIG. 17 is a view showing a thermal resistive value-to-temperature relation with the position of an LD temperature sensor (etalon temperature sensor) as a reference.
Figure 19:
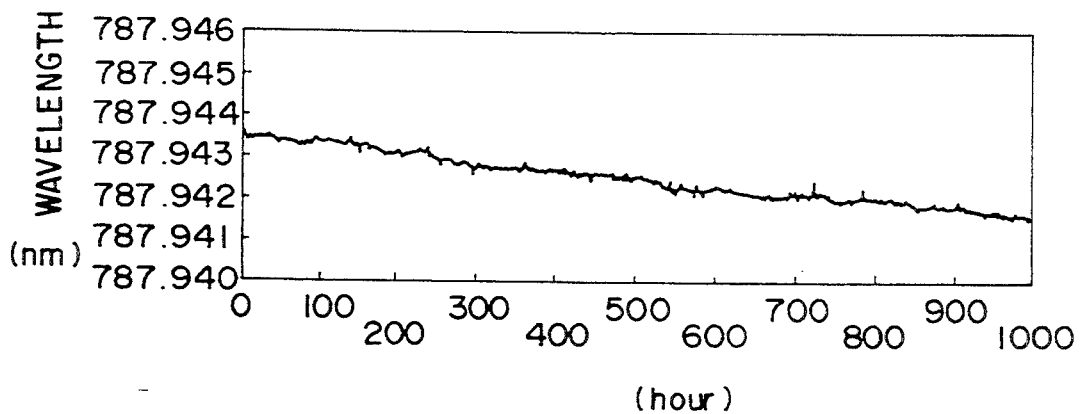
FIG. 19 is a view showing a time lapse variation of a laser diode.
Figure 18:
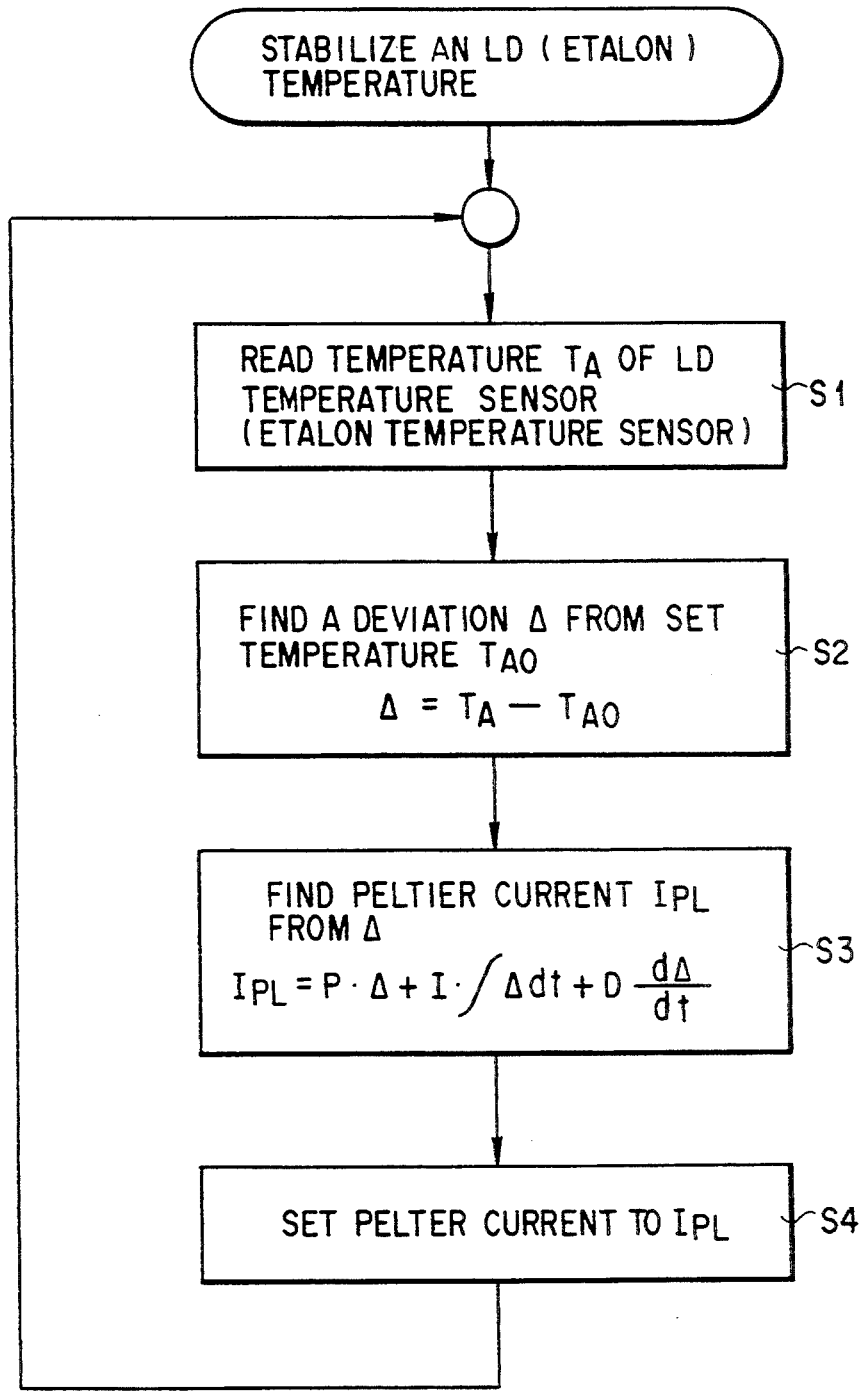
FIG. 18 is a view showing a temperature control flow when the temperature of an LD (etalon) is stabilized.

A variant of the wavelength stabilizing apparatus shown in FIG. 8 (see the third embodiment) is shown, for example, in FIG. 13.

As shown in FIG. 13, the wavelength stabilizing apparatus of the variant is such that a thermistor 118 and ambient temperature sensor 127 are held in a light source section 111.

A thermistor 118 and ambient temperature sensor 127 are electrically connected via a set temperature computation section 129 to an LD temperature controller 117.

Based on the output signal of the set temperature computation section 129 the LD temperature controller 117 controls current in a Peltier element 119 so as to maintain the temperature of LD 112 at a predetermined level.

According to such an arrangement, at the time of starting temperature control, the LD temperature control section 117 performs temperature control on the basis of the initializing temperature of a memory section 120 so as to enable the temperature of LD 112 to become that initializing temperature.

Thereafter, where the ambient temperature varies with a lapse of time, the set temperature computation section 129 computes, based on a difference between the ambient temperature detected by the ambient temperature sensor 127 and an initially set reference ambient temperature, a set temperature obtained with a correction applied to an initializing temperature of the thermistor 118 and delivers an output corresponding to a result of computation to the LD temperature controller 117.

The LD temperature controller 117 controls the current in the Peltier element 119 on the basis of the output signals of PD 116 and set temperature computation section 129 so as to stabilize the temperature of LD 112 to the aforementioned set temperature.

According to the variant of the present invention, it is possible to stabilize the oscillation wavelength of LD 112 to an optimal state at all times so as to correspond to the ambient temperature variation.

It is to be noted that the same thing as in the third embodiment (see FIG. 8) applies to this variant in terms of other advantages and further explanation is omitted.

Figure 10:
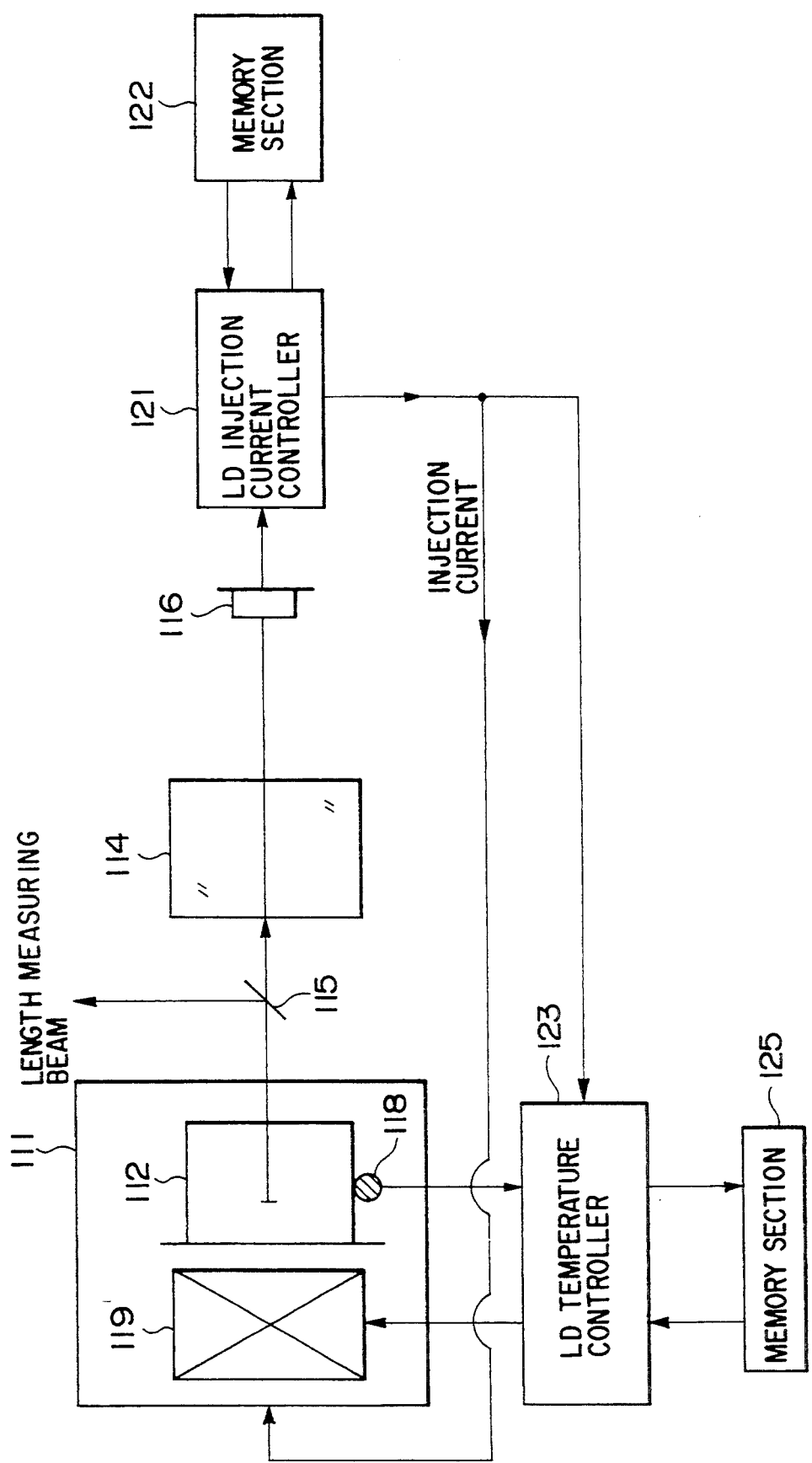
FIG. 10 is a view schematically showing a wavelength stabilizing apparatus according to a fifth embodiment of the present invention.

FIG. 14 shows, for example, a variant of the wavelength stabilizing apparatus shown in FIG. 10 (see the fifth embodiment).

As shown in FIG. 14, the wavelength stabilizing apparatus of the present variant, like in the aforementioned variant (see FIG. 13), incorporates an ambient temperature sensor 127 and set temperature computation section 129 therein.

According to the aforementioned arrangement, where there is an ambient temperature variation at the lapse of time, the set temperature computation section 129 computes, based on a difference between the ambient temperature detected by the ambient temperature sensor 127 and the initially set reference ambient temperature, a set temperature obtained with a correction applied to the initializing temperature of a thermistor 118 and delivers an output corresponding to a result of computation to an LD temperature controller 123.

When control is performed as in the fifth embodiment, the LD temperature controller 123 controls the current in the Peltier element 119, while taking into consideration an output signal from the set temperature computation section 129.

According to the present variant, the oscillation wavelength of LD 112 can be stabilized to an optimal state at all times so as to correspond to the ambient temperature variation.

The variant is the same-as in the aforementioned fifth embodiment (see FIG. 10) in terms of other advantages and further explanation is, therefore, omitted.

INDUSTRIAL APPLICABILITY

As set out above, the wavelength stabilizing apparatus of the present invention can correct a displacement of the oscillation wavelength resulting from an ambient temperature variation and LD's time lapse variation and, therefore, it is found useful to stabilize the oscillation wavelength to a desired wavelength at all times.

We claim:

1. A wavelength stabilizing apparatus characterized by comprising:
   an electric current supply source for supplying a given injection current;
   a semiconductor laser for receiving the injection current from the electric current supply source to output a laser beam;
   a wavelength distinguishing element for distinguishing a wavelength of the laser beam which is output from the semiconductor laser;
   a photodetector for detecting an intensity of the output laser beam from the wavelength distinguishing element; and
   a temperature controller for performing temperature control of the semiconductor laser so as to enable the output of the photodetector to become a predetermined value and for, when the output of the photodetector becomes that predetermined value, reserving a corresponding semiconductor laser temperature and, at a start of the next temperature control, initializing temperature control based on a finally reserved temperature of the semiconductor laser.

2. A wavelength stabilizing apparatus characterized by comprising:
   an electric current supply source for supplying a given injection current;
   a semiconductor laser for receiving the injection current from the electric current source and outputting a laser beam;
   a wavelength distinguishing element for distinguishing a wavelength of the laser beam which is output from the semiconductor laser;

a photodetector for detecting an intensity of the output laser beam from the wavelength distinguishing element;

a temperature controller for performing temperature control of the semiconductor laser so as to enable the output of the photodetector to become a predetermined value; and alarm means for making comparison between a predetermined initializing temperature of the semiconductor laser and a present temperature of the semiconductor laser and, for, when a difference between the initializing temperature and the temperature of the semiconductor laser exceeds a predetermined value, delivering an alarm output.

3. A wavelength stabilizing apparatus characterized by comprising:

a wavelength distinguishing element for distinguishing a wavelength of a laser beam which is output from a semiconductor laser, a photodetector for detecting an intensity of the output laser beam from the wavelength distinguishing element, an injection current controller for controlling an injection current, which is supplied to the semiconductor laser, so as to enable the output of the photodetector to become a predetermined value, and a temperature controller for performing temperature control so as to enable the semiconductor laser to become a set temperature, characterized by further comprising:

an injection current controller for, when the output of the photodetector becomes a predetermined value, reserving a corresponding injection current value and, at a start of controlling the next injection current, initializing control based on a finally reserved injection current value of the semiconductor laser.

4. A wavelength stabilizing apparatus characterized by comprising:

a wavelength distinguishing element for distinguishing a wavelength of a laser beam which is output from a semiconductor laser, a photodetector for detecting an intensity of the output laser beam from the wavelength distinguishing element, an injection current controller for controlling an injection current, which is supplied to the semiconductor laser, so as to enable the output of the photodetector to become a predetermined value, and a temperature controller for performing temperature control so as to bring the semiconductor laser to a set temperature, characterized by comprising:

alarm means for making comparison between a predetermined initial injection current value of the semiconductor laser and a present supply injection current and for, when a difference between the initial injection current value and the present supply injection current exceeds a predetermined value, delivering an alarm output.

5. A wavelength stabilizing apparatus, characterized by comprising:

a semiconductor laser;

a wavelength distinguishing element for distinguishing a wavelength of a laser beam which is output from the semiconductor laser;

a photodetector for detecting an intensity of the output laser beam from the wavelength distinguishing element;

a temperature controller for reserving a temperature of the semiconductor laser and, at the next temperature control time, initiating temperature control based on a finally reserved temperature of the semiconductor laser; and an injection current controller for reserving the injection current value of the semiconductor laser and, at the next injection control start time, initiating control based on a finally reserved injection current value of the semiconductor laser.

6. A wavelength stabilizing apparatus characterized by comprising:

an electric current supply source for supplying an injection current;

a semiconductor laser for receiving the injection current from the electric current supply source;

a temperature sensor for detecting a temperature of the semiconductor laser;

heating/cooling means for heating or cooling the semiconductor laser;

an ambient temperature sensor for detecting an ambient temperature around the semiconductor laser;

a control system for, based on a difference between the ambient temperature detected by the ambient temperature sensor and an initially defined reference ambient temperature, computing a set temperature obtained with a correction applied to the reference set temperature of the temperature sensor; and a temperature controller which, in order to stabilize the temperature which is detected by the temperature sensor to the set temperature, operates the heating/cooling means to enable the semiconductor laser to be heated or cooled.

7. A wavelength stabilizing apparatus characterized by comprising:

an electric current supply source for supplying an injection current;

a semiconductor laser for receiving the injection current from the electric current source and outputting a laser beam;

a temperature sensor for detecting a temperature of the semiconductor laser;

an ambient temperature sensor for detecting an ambient temperature around the semiconductor laser;

a wavelength distinguishing element for distinguishing a wavelength of the output laser beam from the semiconductor laser;

a photodetector for detecting an intensity of the output beam of the wavelength distinguishing element; and a temperature controller for, in order to bring the output of the photodetector to a predetermined value, performing temperature control of the semiconductor laser and, when the output of the photodetector becomes a predetermined value, reserving a corresponding detection temperature of the temperature sensor and corresponding detection temperature of the ambient temperature sensor and, at the next temperature control start time, initiating temperature control of the semiconductor laser with finally reserved detection temperatures of the temperature sensor and ambient temperature sensor as a reference set temperature of the temperature sensor and reference ambient temperature of the ambient temperature sensor, respectively.

8. A wavelength stabilizing apparatus characterized by comprising:

a semiconductor laser;

a temperature sensor for detecting a temperature of the semiconductor laser;

an ambient temperature sensor for detecting an ambient temperature around the semiconductor laser;

a wavelength distinguishing element for distinguishing a wavelength of a laser beam which is output from the semiconductor laser;

a photodetector for detecting an intensity of the output laser beam from the wavelength distinguishing element;

a temperature controller for reserving the detection temperatures of the temperature sensor and ambient temperature sensor and, at the next temperature control start time, initiating temperature control of the semiconductor laser with finally reserved detection temperatures of the temperature sensor and ambient temperature sensor as a reference set temperature of the temperature sensor and reference ambient temperature of the ambient temperature sensor, respectively; and an injection current controller for reserving an injection current value of the semiconductor laser and, at the next injection current control time, initiating control based on a finally reserved injection current of the semiconductor laser.

9. A wavelength stabilizing apparatus characterized by comprising:

a wavelength distinguishing element providing a wavelength reference on which a wavelength of a semiconductor laser is stabilized;

a temperature sensor for detecting a temperature of the wavelength distinguishing element;

heating/cooling means for heating or cooling the wavelength distinguishing element;

an ambient temperature sensor for detecting an ambient temperature around the wavelength distinguishing element;

a control system for, based on a difference between an ambient temperature detected by the ambient temperature sensor and an initially defined reference ambient temperature, computing a set temperature obtained with a correction applied to a reference set temperature of the temperature sensor; and a control system for operating the heating/cooling means so as to stabilize the temperature which is detected by the temperature sensor to the set temperature and for heating or cooling the wavelength distinguishing element.

* * * * *